United States Patent
Koga (10) Patent No.: US 11,088,528 B2
(45) Date of Patent: Aug. 10, 2021

(54) ARC DETECTION CIRCUIT, SWITCH SYSTEM, POWER CONDITIONER SYSTEM AND ARC DETECTION METHOD

(71) Applicant: Panasonic Intellectual Property Management Co., Ltd., Osaka (JP)

(72) Inventor: Tatsuo Koga, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 90 days.

(21) Appl. No.: 16/483,414

(22) PCT Filed: Jan. 31, 2018

(86) PCT No.: PCT/JP2018/003202
§ 371 (c)(1),
(2) Date: Aug. 3, 2019

(87) PCT Pub. No.: WO2018/150877
PCT Pub. Date: Aug. 23, 2018

(65) Prior Publication Data
US 2020/0014188 A1  Jan. 9, 2020

(30) Foreign Application Priority Data
Feb. 14, 2017  (JP) .............. JP2017-025456

(51) Int. Cl.
*H02H 1/00*  (2006.01)
*G05F 3/08*  (2006.01)
*H02H 3/16*  (2006.01)

(52) U.S. Cl.
CPC ............. *H02H 1/0015* (2013.01); *G05F 3/08* (2013.01); *H02H 3/16* (2013.01)

(58) Field of Classification Search
CPC ........ H02H 9/046; H02H 3/16; H02H 1/0015; H02H 7/26; H02H 1/0023; G05F 3/08; G01R 31/08
See application file for complete search history.

(56) References Cited

U.S. PATENT DOCUMENTS 5,452,223 A   9/1995 Zuercher
6,567,250 B1 * 5/2003 Haun ............... H01H 71/125
                                                361/42

(Continued)

FOREIGN PATENT DOCUMENTS

JP    07-236224 A    9/1995
JP    2001-045652 A  2/2001

(Continued)

OTHER PUBLICATIONS

International Search Report (ISR) dated Apr. 17, 2018 in International (PCT) Application No. PCT/JP2018/003202.

(Continued)

*Primary Examiner* — Alex Torres-Rivera
(74) *Attorney, Agent, or Firm* — Renner, Otto, Boisselle & Sklar, LLP (57) ABSTRACT

An arc detection circuit that detects an arc that occurs in a transmission path that transmits power from a power supply apparatus to a power conditioner, the arc detection circuit includes: a current detector that detects a current flowing through the transmission path; a storage unit configured to store a base characteristic which is a frequency characteristic of the current flowing through the transmission path when the arc is not present; and an arc determination unit configured to determine whether the arc has occurred based on a result of a comparison between the base characteristic and a detection characteristic which is a frequency characteristic of the current detected by the current detector.

5 Claims, 6 Drawing Sheets

(56) References Cited

U.S. PATENT DOCUMENTS

| | | | |
|---|---|---|---|
| 2004/0156154 A1 | 8/2004 | Lazarovich | |
| 2009/0284265 A1 | 11/2009 | Onta | |
| 2011/0019444 A1 | 1/2011 | Dargatz | |
| 2014/0071564 A1* | 3/2014 | Kim | H02H 3/162 |
| | | | 361/42 |
| 2016/0181799 A1* | 6/2016 | Kanemaru | H02H 7/20 |
| | | | 307/78 |
| 2016/0216305 A1* | 7/2016 | Krenz | H02H 1/0015 |
| 2016/0301199 A1* | 10/2016 | Mori | H01H 33/59 |
| 2016/0351042 A1* | 12/2016 | Chae | G01R 31/1272 |
| 2017/0025842 A1* | 1/2017 | Peterson | H02H 3/04 |
| 2017/0141722 A1* | 5/2017 | Misumi | H02H 1/0015 |
| 2018/0040444 A1* | 2/2018 | Ku | H02J 1/00 |
| 2018/0201142 A1* | 7/2018 | Galin | H02J 7/0042 |
| 2018/0231597 A1* | 8/2018 | Ashida | H02S 50/00 |
| 2018/0233901 A1* | 8/2018 | Ashida | H02H 1/0015 |
| 2019/0296539 A1* | 9/2019 | Kanemaru | H02H 3/06 |

FOREIGN PATENT DOCUMENTS

| | | |
|---|---|---|
| JP | 2003-317598 A | 11/2003 |
| JP | 2006-517781 A | 7/2006 |
| JP | 2009-278744 A | 11/2009 |
| JP | 2011-7765 A | 1/2011 |
| JP | 2013-500476 A | 1/2013 |
| JP | 2015-211606 A | 11/2015 |
| WO | 2004073131 A1 | 8/2004 |
| WO | 2011011711 A2 | 1/2011 |

OTHER PUBLICATIONS

Written Opinion dated Apr. 17, 2018 in International (PCT) Application No. PCT/JP2018/003202.

* cited by examiner

ARC DETECTION CIRCUIT, SWITCH SYSTEM, POWER CONDITIONER SYSTEM AND ARC DETECTION METHOD

TECHNICAL FIELD

The present invention relates to an arc detection circuit, a switch system, a power conditioner system, and an arc detection method that detect an arc in a transmission path.

BACKGROUND ART

Conventionally, a system has been known that converts, by a power conditioner, direct-current power supplied from a power supply apparatus via a transmission path, such as a photovoltaic (PV) panel, into alternating-current power. Since the transmission path that connects the PV panel and the power conditioner is often placed outside, the transmission path deteriorates easily. Such deterioration of the transmission path may cause an arc (i.e., arc discharge). In order to interrupt the current that flows through a transmission path when an arc occurs, a switch is provided in the transmission path. However, when an arc has occurred, the current sometimes does not flow large enough to cause the switch to trip. Thus, the current may continue to flow through the transmission path when an arc has occurred. In view of the above, an arc detection means for detecting an arc has been proposed (for example, Patent Literature (PTL) 1). The arc detection means disclosed in PTL 1 tries to detect an arc based on the voltage and the current that are applied to the transmission path.

CITATION LIST

Patent Literature

PTL 1: Japanese Unexamined Patent Application Publication No. 2011-7765

SUMMARY OF THE INVENTION

Technical Problem

However, the arc detection means disclosed in PTL 1 cannot sufficiently distinguish between changes in voltage and current due to an arc, and changes in voltage and current due to other factors such as noise other than an arc.

In view of the above, an object of the present invention is to provide an arc detection circuit, etc. that can accurately detect an arc that occurs in the transmission path that transmits power from a power supply apparatus.

Solution To Problem

In order to achieve the above object, an arc detection circuit according to one aspect of the present invention is an arc detection circuit that detects an arc that occurs in a transmission path that transmits power from a power supply apparatus to a power conditioner, the arc detection circuit includes: a current detector that detects a current flowing through the transmission path; a storage unit configured to store a base characteristic which is a frequency characteristic of the current flowing through the transmission path when the arc is not present; and an arc determination unit configured to determine whether the arc has occurred based on a result of a comparison between the base characteristic and a detection characteristic which is a frequency characteristic of the current detected by the current detector.

Furthermore, in order to achieve the above object, a switch system according to one aspect of the present invention includes: the arc detection circuit; and a switch that is controlled based on a signal outputted from the arc detection circuit.

Furthermore, in order to achieve the above object, a power conditioner system according to one aspect of the present invention includes: the arc detection circuit; and a power conditioner to which power from the power supply apparatus is supplied via the transmission path.

Furthermore, in order to achieve the above object, an arc detection method according to one aspect of the present invention is an arc detection method for detecting an arc in a transmission path that transmits power from a power supply apparatus to a power conditioner, the arc detection method includes: detecting a current flowing through the transmission path; storing a base characteristic which is a frequency characteristic of the current flowing through the transmission path when the arc is not present; and determining whether the arc has occurred based on a result of a comparison between the base characteristic and a detection characteristic which is a frequency characteristic of the current detected in the detecting.

Advantageous Effect of Invention

According to one aspect of the present invention, it is possible to provide an arc detection circuit, etc. that can accurately detect an arc that occurs in the transmission path that transmits power from a power supply apparatus.

DESCRIPTION OF EXEMPLARY EMBODIMENTS

Hereinafter, embodiments of the present invention are described with reference to the drawings. The embodiments described below each show a specific example of the present invention. Therefore, the numerical values, shapes, materials, structural elements, and the positioning and connection of the structural elements, for instance, presented in the following embodiments are mere examples, and thus are not intended to limit the present invention. Therefore, among the structural elements in the embodiment below, structural elements not recited in any one of independent claims which indicate the broadest concepts of the present disclosure are described as optional structural elements.

Note that the respective drawings are schematic illustrations and are not necessarily precise illustrations. Additionally, structural elements that are essentially the same share like reference numerals in the respective drawings, and overlapping explanations thereof are omitted or simplified.

Embodiment 1

[1-1. Overall Configuration]

An overall configuration of an arc detection circuit according to Embodiment 1 will be described with reference to the drawings.

Figure 1:
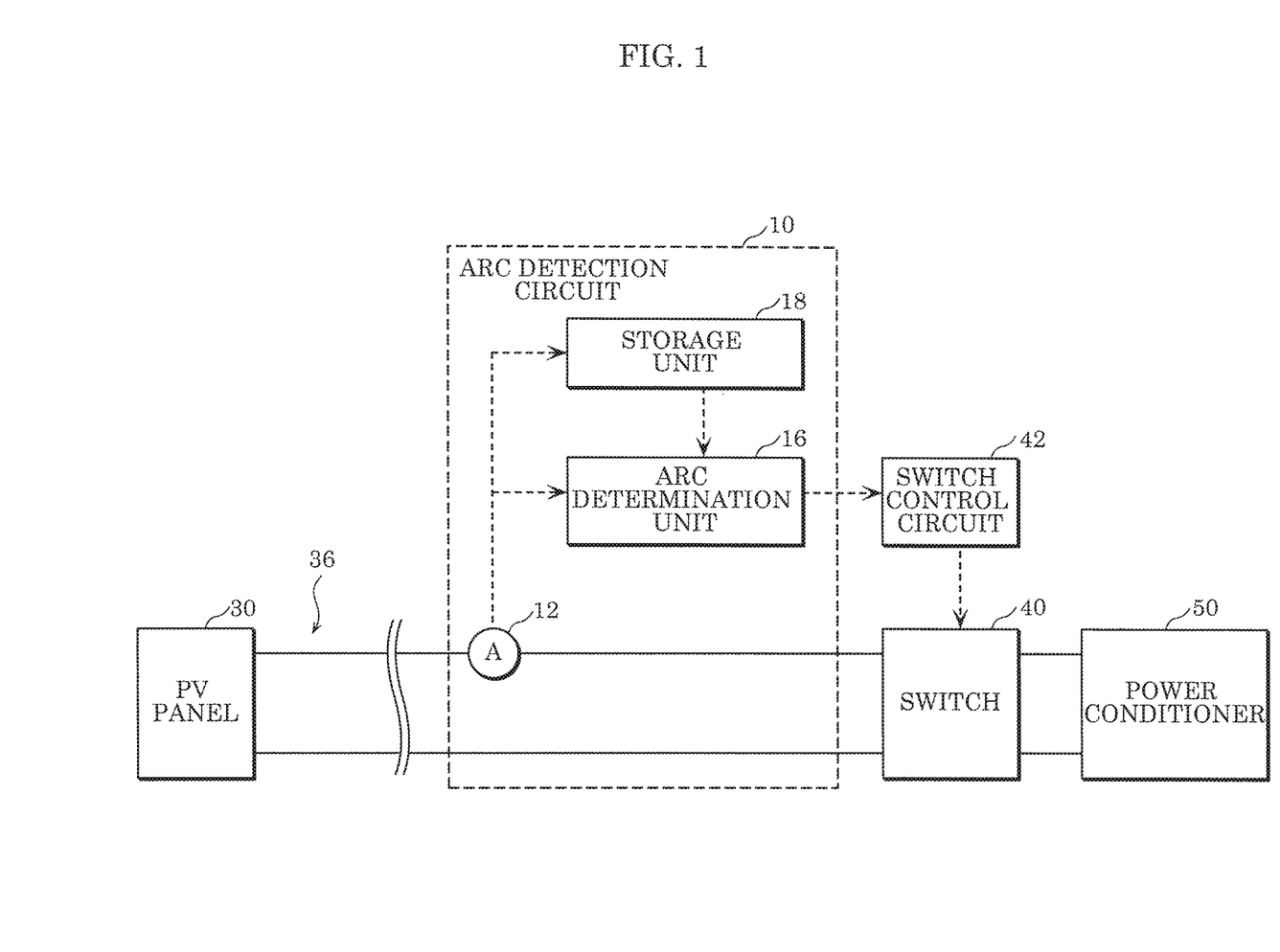
FIG. 1 is a block diagram illustrating an overall configuration of an arc detection circuit according to Embodiment 1.

FIG. 1 is a block diagram illustrating the overall configuration of arc detection circuit 10 according to the present embodiment. Note that FIG. 1 illustrates transmission path 36 in which arc detection circuit 10 is provided, PV panel 30 connected to transmission path 36, switch 40, power conditioner 50, and switch control circuit 42 that switches between opening and closing of switch 40.

PV panel 30 is an example of a power supply apparatus that outputs direct-current power to transmission path 36. Note that, although PV panel 30 is used as an example of the power supply apparatus in the present embodiment, the power supply apparatus is not limited to PV panel 30. For example, the power supply apparatus may be a power generating apparatus other than PV panel 30.

Transmission path 36 includes power lines that transmit the direct-current power outputted from the power supply apparatus, for example, PV panel 30, to power conditioner 50. Transmission path 36 includes lead wires made of a conductive material such as copper, and coating made of an insulating material that protects the lead wires. For example, an arc may occur when the coating deteriorates.

Switch 40 is an electric device that switches between opening and closing of transmission path 36. In the present embodiment, switch 40 switches between opening and closing based on the signal from switch control circuit 42.

Switch control circuit 42 is a driver that controls opening and closing of switch 40. In the present embodiment, switch control circuit 42 controls opening and closing of switch 40, based on a signal from arc detection circuit 10.

Power conditioner 50 is a device to which the direct-current power outputted from the power supply apparatus is supplied via transmission path 36, and power conditioner 50 converts the supplied direct-current power into alternating-current power, and outputs the alternating-current power. In the present embodiment, for example, power conditioner 50 uses a maximum power point tracking (MPPT) method. Power conditioner 50 adjusts the current and the voltage of the direct-current power supplied from PV panel 30 to values that maximize the power. Power conditioner 50 converts the inputted direct-current power into alternating-current power having a voltage of 100 V and a frequency of 50 Hz or 60 Hz, for example. Accordingly, the alternating-current power outputted from power conditioner 50 can be used by a home electric appliance, etc.

Arc detection circuit 10 is a circuit that detects an arc that occurs in transmission path 36 that transmits power to power conditioner 50 from the power supply apparatus. Arc detection circuit 10 includes current detector 12, arc determination unit 16, and storage unit 18.

Current detector 12 is a detector that detects a current flowing through transmission path 36. In the present embodiment, current detector 12 detects the current supplied from PV panel 30, and outputs a signal corresponding to the detected current to arc determination unit 16 and storage unit 18.

Current detector 12 may include, for example, a resistance element having an extremely small resistance value. A value corresponding to the current flowing through transmission path 36 can be detected by inserting such a resistance element in transmission path 36, and detecting the voltage applied to the resistance element.

Storage unit 18 stores a base characteristic which is a frequency characteristic of the current that flows through transmission path 36 when an arc is not present. In the present embodiment, storage unit 18 obtains a base characteristic based on the current detected by current detector 12 when an arc is not present in transmission path 36 and stores the base characteristic. Storage unit 18 obtains the frequency spectrum of a current signal by Fourier-transforming the time waveform of the current signal inputted from current detector 12 when an arc is not present, for example. Storage unit 18 stores the obtained frequency spectrum as a base characteristic. As described above, storage unit 18 according to the present embodiment obtains the base characteristic based on the current detected when an arc is not present.

Arc determination unit 16 is a processing unit that determines whether an arc has occurred based on a result of a comparison between a detection characteristic which is a frequency characteristic of the current detected by current detector 12, and the base characteristic stored in storage unit 18. The current signal corresponding to the current flowing through transmission path 36 is inputted to arc determination unit 16 by current detector 12. Arc determination unit 16 obtains the frequency spectrum of the current signal by Fourier-transforming the time waveform of the current signal, for example. Arc determination unit 16 uses the obtained frequency spectrum as the detection characteristic to determine whether an arc has occurred.

In the present embodiment, a current difference is calculated, which is a difference between the frequency spectrum corresponding to the detection characteristic and the frequency spectrum corresponding to the base characteristic. When the maximum value of the frequency spectrum of the current difference exceeds a first threshold, it is determined that an arc has occurred in transmission path 36. When the maximum value of the frequency spectrum of the current difference is less than or equal to the first threshold, it is determined that an arc has not occurred in transmission path 36. Here, the first threshold is determined based on an experiment. For example, a detection characteristic when an arc is present in transmission path 36 and a detection characteristic (i.e., base characteristic) when an arc is not present may be obtained in advance, and a value less than or equal to the maximum value of the difference between the frequency spectra corresponding to these characteristics may be determined as the first threshold.

Arc determination unit 16 outputs a signal to switch control circuit 42, when arc determination unit 16 determines that an arc has occurred. Accordingly, a signal for causing switch 40 to be an open state is outputted from switch control circuit 42. This switches switch 40 to the open state and transmission of the power from PV panel 30 to power conditioner 50 is interrupted. This can reduce or prevent a situation in which the power is kept transmitted while an arc is present.

Arc determination unit 16 is implemented by a microcontroller unit (MCU), for example. The microcontroller unit is a one-chip semiconductor integrated circuit having an input and output circuit including read-only memory (ROM) in which a program is stored, random-access memory (RAM), a processor (central processing unit; CPU) that executes the program, a timer, an analog-to-digital converter (A to D converter), a digital-to-analog converter (D to A converter), and so on.

[1-2. Operation]

Next, operation of arc detection circuit 10 according to the present embodiment will be described with reference to the drawings.

Figure 2:
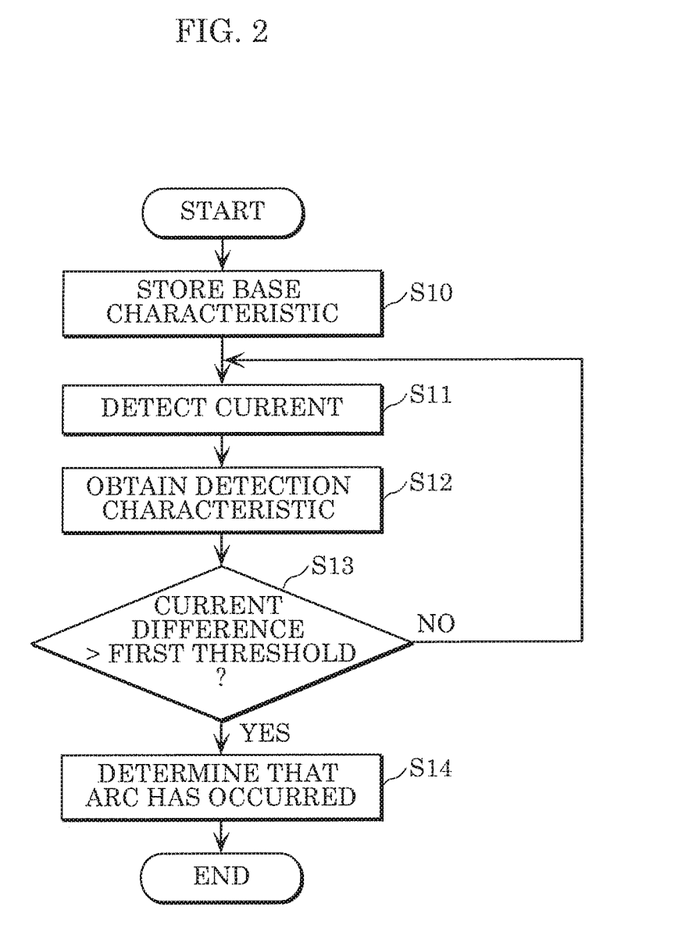
FIG. 2 is a flowchart illustrating an arc detection method performed by the arc detection circuit according to Embodiment 1.
Figure 3:
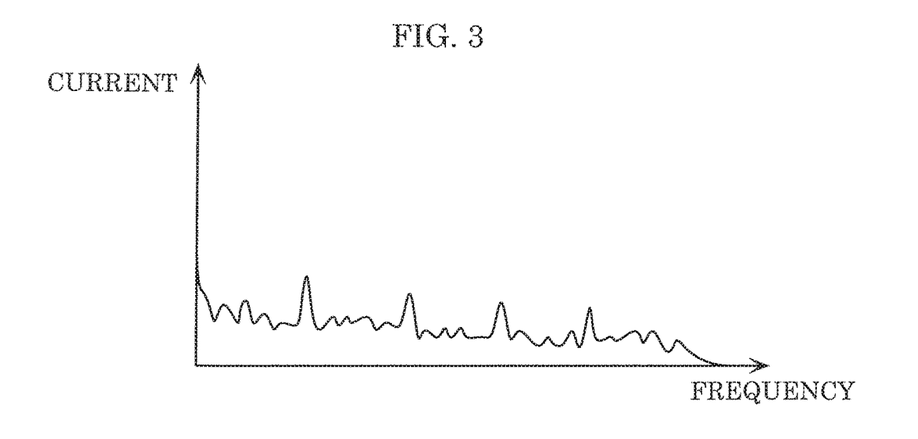
FIG. 3 is a graph showing an example of a frequency spectrum of a current corresponding to a base characteristic stored in a storage unit according to Embodiment 1.
Figure 4:
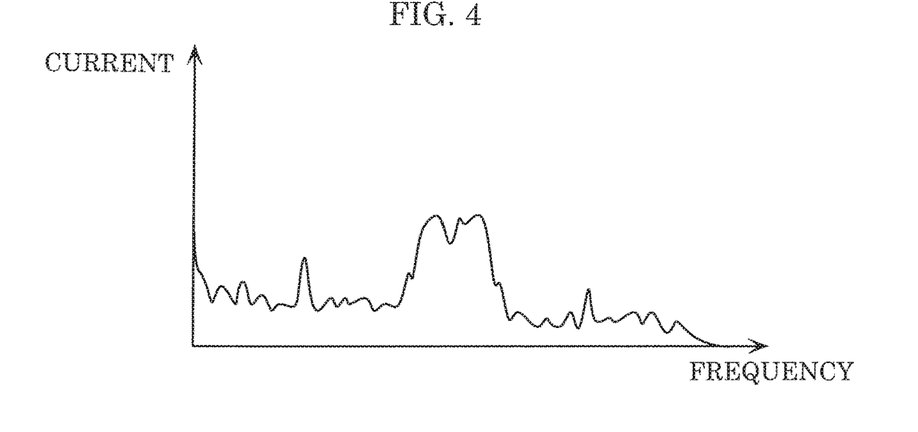
FIG. 4 is a graph showing an example of a frequency spectrum of a current corresponding to a detection characteristic to be used by an arc determination unit according to Embodiment 1.
Figure 5:
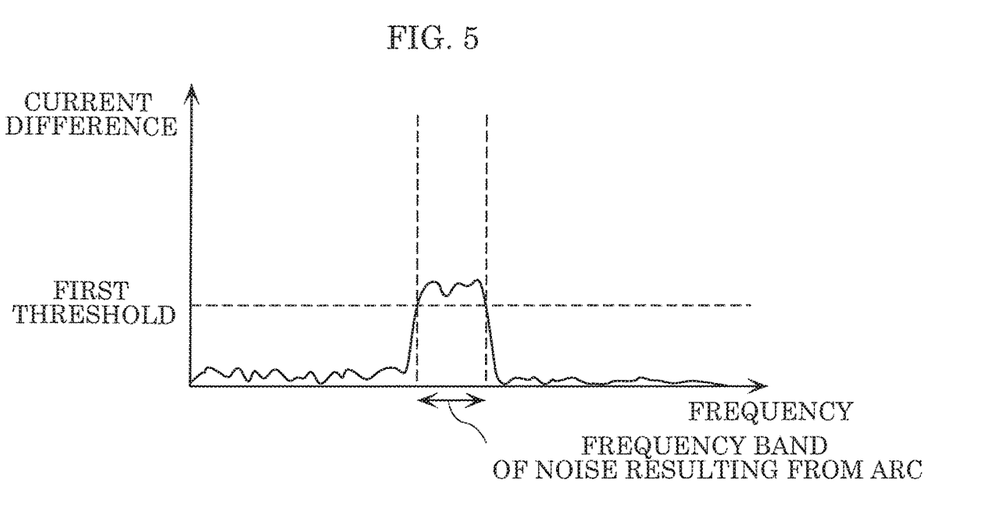
FIG. 5 is a graph showing an example of a frequency spectrum showing a difference between the frequency spectrum corresponding to the detection characteristic and the frequency spectrum corresponding to the base characteristic, the difference being calculated by the arc determination unit according to Embodiment 1.

FIG. 2 is a flowchart illustrating an arc detection method performed by arc detection circuit 10 according to the present embodiment. FIG. 3 is a graph showing an example of a frequency spectrum of a current corresponding to a base characteristic stored in storage unit 18 according to the present embodiment. FIG. 4 is a graph showing an example of a frequency spectrum of a current corresponding to a detection characteristic to be used by arc determination unit 16 according to the present embodiment. Note that FIG. 4 shows an example of the frequency spectrum of the current corresponding to the detection characteristic obtained by arc determination unit 16 when an arc is present. FIG. 5 is a graph showing an example of a frequency spectrum showing a difference between the frequency spectrum corresponding to the detection characteristic and the frequency spectrum corresponding to the base characteristic, the difference being calculated by arc determination unit 16 according to the present embodiment.

As illustrated in FIG. 2, first, storage unit 18 in arc detection circuit 10 stores the base characteristic (S10). In the present embodiment, storage unit 18 obtains a base characteristic having a frequency spectrum such as that shown in FIG. 3 based on the current detected by current detector 12 when an arc is not present in transmission path 36 and stores the base characteristic. The base characteristic includes noise irrelevant to an arc, such as noise resulting from power conditioner 50 or transmission path 36.

Subsequently, current detector 12 detects the current supplied from the power supply apparatus via transmission path 36 (S11). In the present embodiment, current detector 12 detects the current supplied from PV panel 30, which is an example of the power supply apparatus, and the current signal corresponding to the detected current is outputted to arc determination unit 16.

Subsequently, arc determination unit 16 obtains a detection characteristic from the current signal inputted by current detector 12 (S12). The current signal corresponding to the current that flows through transmission path 36 is inputted to arc determination unit 16 by current detector 12. Arc determination unit 16 obtains a frequency spectrum of the current signal such as that shown in FIG. 4 by Fourier-transforming the time waveform of the current signal, for example. Noise irrelevant to an arc and noise resulting from an arc are included in the detection characteristic.

Subsequently, arc determination unit 16 compares the detection characteristic obtained in Step S12 with the base characteristic stored in storage unit 18. In the present embodiment, a current difference which is a difference between the frequency spectrum corresponding to the detection characteristic and the frequency spectrum corresponding to the base characteristic is compared with the first threshold (S13). The current difference, which is a difference between the frequency spectrum corresponding to the detection characteristic and the frequency spectrum corresponding to the base characteristic, has a frequency spectrum such as that shown in FIG. 5. Obtaining such a current difference makes it possible to remove most of the noise components common to the base characteristic and the detection characteristic, as shown in FIG. 5. The frequency band of the noise which is not removed in the current difference shown in FIG. 5 is considered to be a frequency band of the noise due to an arc. When an arc has occurred in transmission path 36, noise having a specific frequency band increases.

Referring back to FIG. 2, when arc determination unit 16 determines that the current difference is not greater than the first threshold (NO in S13), the operation returns to Step S11.

On the other hand, when arc determination unit 16 determines that the current difference is greater than the first threshold (YES in S13), arc determination unit 16 determines that an arc has occurred (S14). In other words, arc detection circuit 10 detects an arc. Arc determination unit 16 outputs a signal to switch control circuit 42, when arc determination unit 16 determines that an arc has occurred. Accordingly, switch 40 is switched to the open state by switch control circuit 42, and transmission of the power from PV panel 30 to power conditioner 50 is interrupted.

As described above, arc detection circuit 10 according to the present embodiment determines that an arc has occurred based on the result of a comparison between the base characteristic of the current when an arc is not present, and the detection characteristic. Thus, the noise irrelevant to an arc and included in the base characteristic can be distinguished from the noise resulting from an arc. The noise resulting from an arc is included in the detection characteristic and not included in the base characteristic. Thus, arc detection circuit 10 can reduce an erroneous detection of an arc due to a noise irrelevant to an arc. In other words, arc detection circuit 10 according to the present embodiment can detect an arc accurately.

Furthermore, storage unit 18 according to the present embodiment obtains the base characteristic based on the current detected when an arc is not present. Thus, arc detection circuit 10 can use the base characteristic obtained in a similar manner as the detection characteristic. This makes it possible to approximately match the frequency characteristic that is irrelevant to an arc and included in the base characteristic, and the frequency characteristic that is irrelevant to an arc and included in the detection characteristic. Accordingly, for example, the noise irrelevant to an arc and the noise resulting from an arc can be distinguished from each other more clearly by calculating the difference between the detection characteristic and the base characteristic as described above.

[1-3. Conclusion]

As described above, arc detection circuit 10 according to the present embodiment includes: current detector 12 that detects a current flowing through transmission path 36; storage unit 18 configured to store a base characteristic which is a frequency characteristic of the current flowing through transmission path 36 when the arc is not present; and arc determination unit 16 configured to determine whether the arc has occurred based on a result of a comparison between the base characteristic and a detection characteristic which is a frequency characteristic of the current detected by current detector 12.

With this, the noise that is irrelevant to an arc and included in the base characteristic can be distinguished from the noise resulting from an arc that is included in the detection characteristic and not included in the base characteristic. Thus, arc detection circuit 10 can reduce an erroneous detection of an arc due to noise irrelevant to an arc. In other words, arc detection circuit 10 according to the present embodiment can detect an arc accurately.

Furthermore, in arc detection circuit 10, storage unit 18 may obtain the base characteristic based on the detected current when an arc is not present.

Thus, arc detection circuit 10 can use the base characteristic obtained in a similar manner as the detection characteristic. Accordingly, the frequency characteristic of the noise irrelevant to an arc included in each of the base characteristic and the detection characteristic can be approximately matched. Accordingly, for example, the noise irrelevant to an arc and the noise resulting from an arc can be distinguished from each other more clearly by calculating the difference between the detection characteristic and the base characteristic as described above.

Furthermore, the arc detection method according to the present embodiment includes: detecting a current flowing through transmission path 36; storing a base characteristic which is a frequency characteristic of the current flowing through transmission path 36 when an arc is not present; and determining whether an arc has occurred based on a result of a comparison between the base characteristic and a detection characteristic which is a frequency characteristic of the current detected in the detecting.

This achieves the same effects as the effects obtained with arc detection circuit 10.

Embodiment 2

Next, an arc detection circuit according to Embodiment 2 will be described. The arc detection circuit according to the present embodiment differs from arc detection circuit 10 according to Embodiment 1 in that the arc detection circuit according to the present embodiment properly uses different base characteristics in accordance with the operational conditions of a power conditioner. Hereinafter, the arc detection circuit according to the present embodiment is described with reference to the drawings by focusing on the points different from arc detection circuit 10 according to Embodiment 1.

Figure 6:
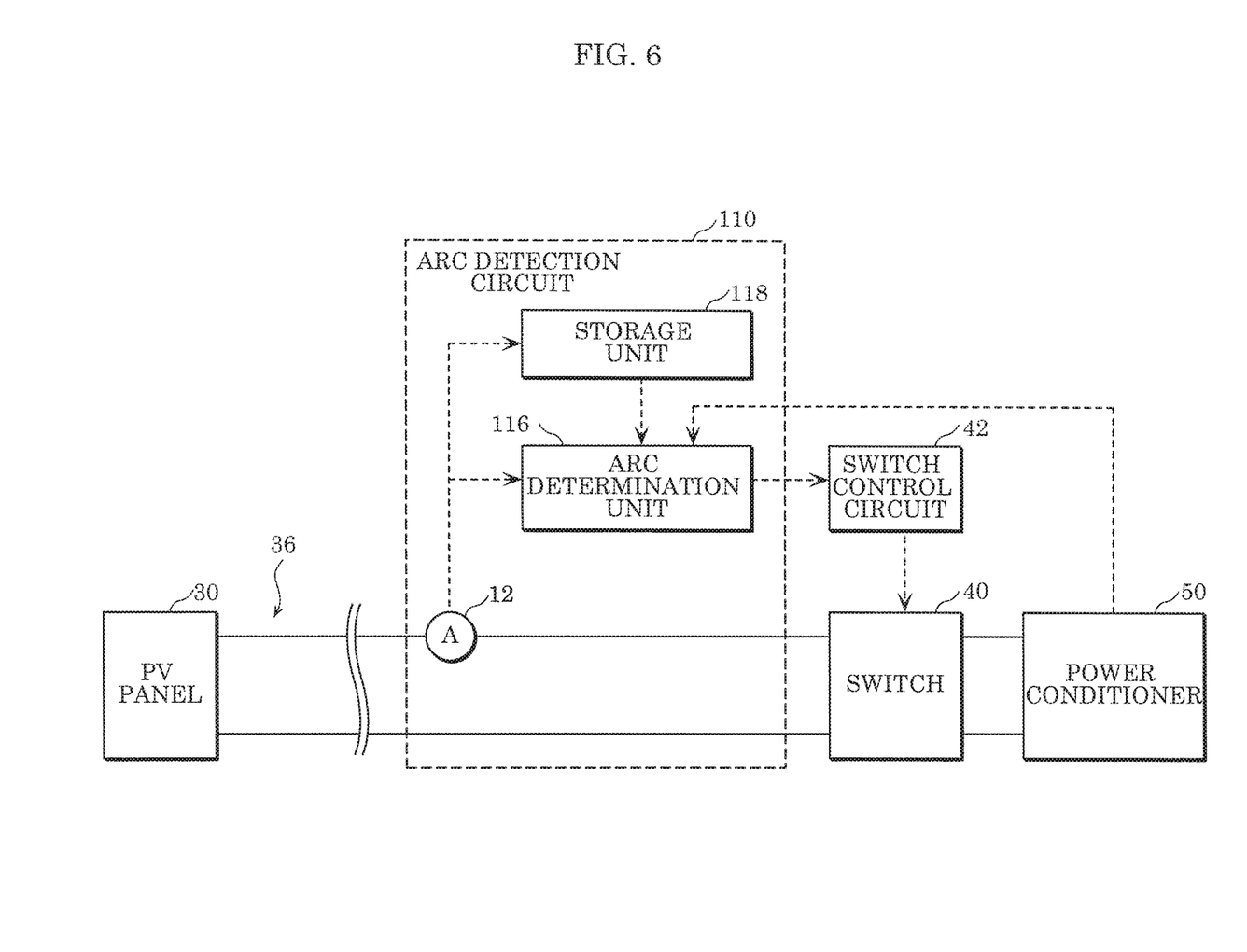
FIG. 6 is a block diagram illustrating an overall configuration of an arc detection circuit according to Embodiment 2.
Figure 7:
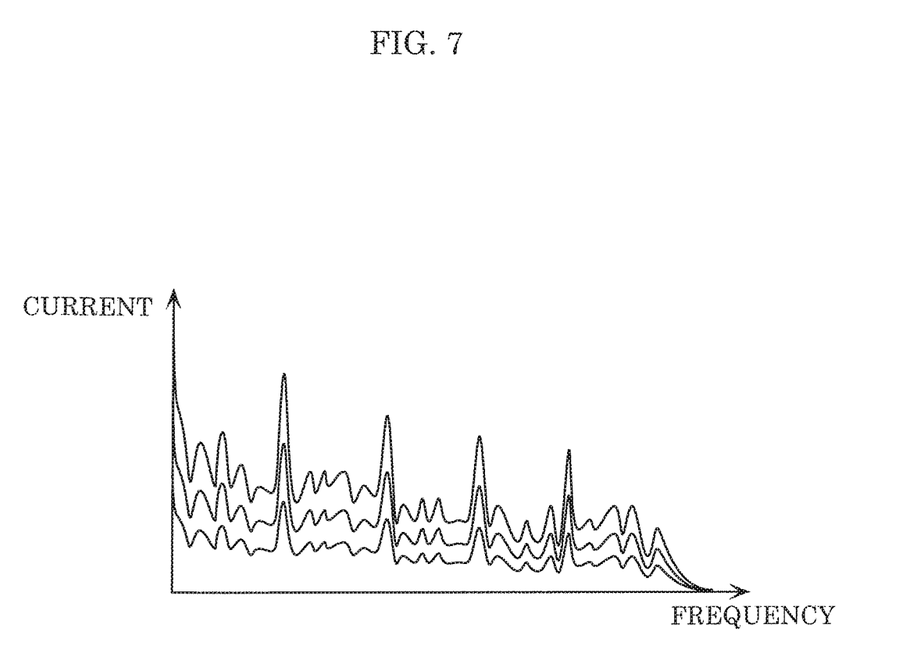
FIG. 7 is a graph showing frequency spectra of currents corresponding to base characteristics stored in a storage unit according to Embodiment 2.

FIG. 6 is a block diagram illustrating an overall configuration of arc detection circuit 110 according to the present embodiment. FIG. 7 is a graph showing frequency spectra of currents corresponding to base characteristics stored in storage unit 118 according to the present embodiment.

As illustrated in FIG. 6, arc detection circuit 110 includes current detector 12, arc determination unit 116, and storage unit 118, similar to arc detection circuit 10 according to Embodiment 1.

Arc detection circuit 110 is different from arc determination unit 16 according to Embodiment 1 in the configurations of arc determination unit 116 and storage unit 118.

Storage unit 118 according to the present embodiment stores a plurality of base characteristics, each corresponding to a different one of the operating conditions of power conditioner 50. Generally, the intensity of the noise that is generated in power conditioner 50 changes according to the power supplied to power conditioner 50. Thus, according to the operating condition of power conditioner 50, the base characteristic changes as shown in FIG. 7. Note that the base characteristics in three cases are shown in FIG. 7, and the power inputted to power conditioner 50 in these cases differ from one another. Generally, the noise that is generated in the power conditioner increases as the power inputted to the power conditioner becomes larger.

Accordingly, in the present embodiment, arc detection circuit 110 stores base characteristics each corresponding to a different one of the operating conditions of power conditioner 50. This makes it possible to properly use different base characteristics in accordance with the operating condition of power conditioner 50. Accordingly, it is possible to further reduce the difference between noise characteristic that is irrelevant to an arc and included in the detection characteristic, and the base characteristic.

Arc determination unit 116 according to the present embodiment determines whether an arc has occurred in transmission path 36 based on a result of a comparison between the detection characteristic and one base characteristic selected from among the base characteristics stored in storage unit 118 based on one of the operating conditions of the power conditioner. In the present embodiment, a signal indicating the operating condition is inputted to arc determination unit 116 from power conditioner 50. Accordingly, the base characteristic suitable for the operating condition of power conditioner 50 can be selected from among the base characteristics stored in storage unit 118. Note that arc determination unit 116 may obtain information indicating the operating condition from another device, for example. For example, the information indicating the operating condition may be obtained based on the voltage and the current applied to transmission path 36.

As described above, in arc detection circuit 110 according to the present embodiment, storage unit 118 is configured to store a plurality of base characteristics, each corresponding to a different one of operating conditions of power conditioner 50, the plurality of base characteristics each being the base characteristic, and arc determination unit 116 is configured to determine whether the arc has occurred in transmission path 36 based on a result of a comparison between the detection characteristic and one base characteristic that is selected from among the plurality of base characteristics based on one of the operating conditions of power conditioner 50.

Accordingly, storage unit 118 stores base characteristics each corresponding to a different one of the operating conditions of power conditioner 50. This makes it possible to properly use different base characteristics in accordance with the operating condition of power conditioner 50. With this, in arc detection circuit 110, a difference can be reduced between noise characteristic that is irrelevant to an arc and included in the detection characteristic, and the base characteristic. Thus, arc detection circuit 110 can detect an arc still more accurately.

Note that base characteristics stored in storage unit 18 in arc detection circuit 110 according to the present embodiment may be obtained based on the currents detected when an arc is not present, similar to storage unit 18 according to Embodiment 1. Moreover, the base characteristics may be generated in advance based on, for example, an experiment, a simulation, and stored in storage unit 118.

Moreover, storage unit 118 may store base characteristics, each corresponding to a different one of the operating conditions of a plurality of types of power conditioners, and arc determination unit 116 may determine whether an arc has occurred in transmission path 36 based on the result of a comparison between the detection characteristic and the one base characteristic selected based on the type of the power conditioner from among the base characteristics.

Since this makes it possible to use the base characteristic according to the type of the power conditioner, the difference between noise characteristic that is irrelevant to an arc and included in the detection characteristic, and the base characteristic can also be reduced when the type of the power conditioner connected to transmission path 36 is changed. (Variation, etc.)

While the present invention has been described based on each embodiment above, the present invention is not limited to each of the above embodiments.

Figure 8:
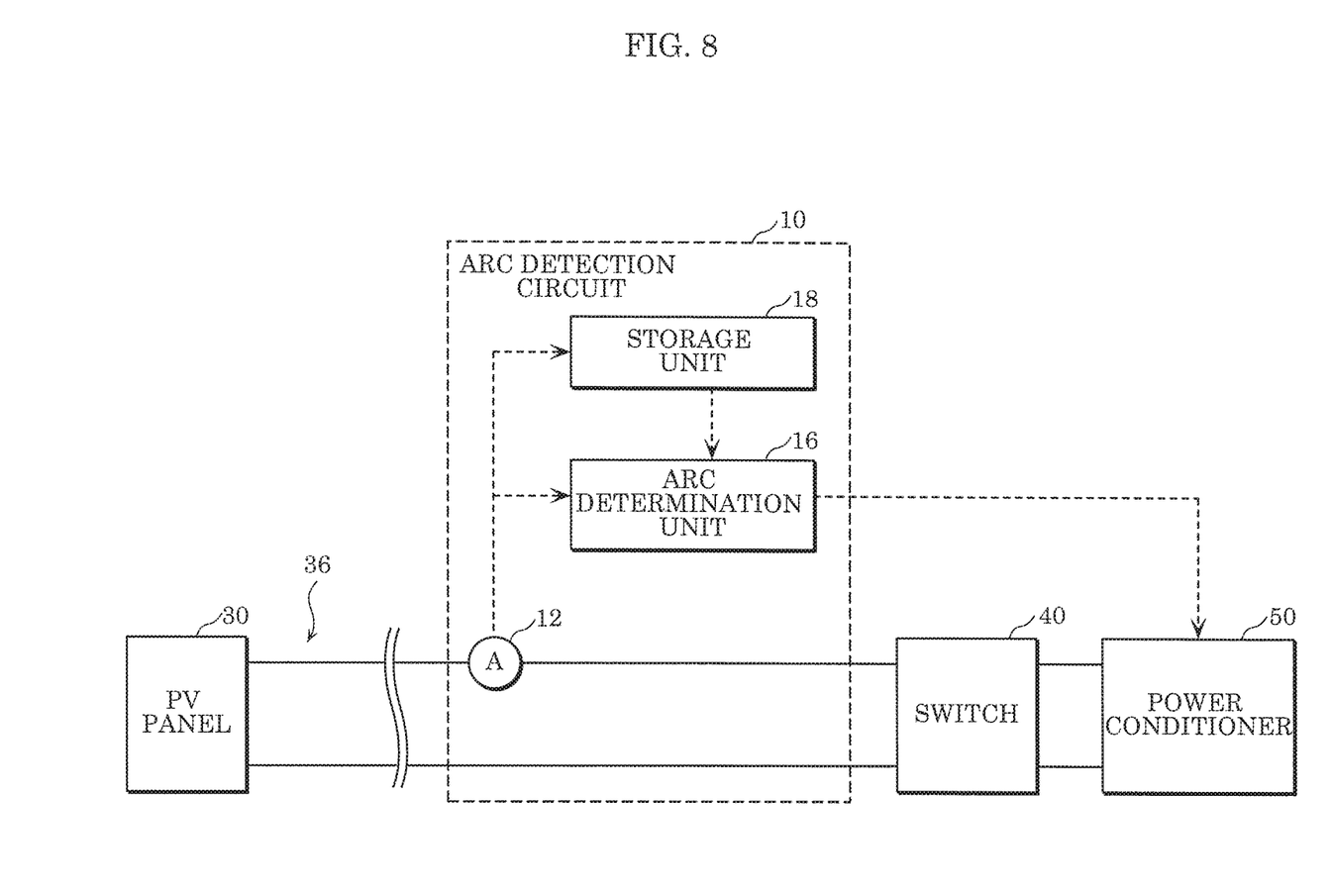
FIG. 8 is a block diagram illustrating another connection configuration of arc detection circuit 10 according to Embodiment 1.

For example, although the arc detection circuit according to each of the above embodiments outputs a signal to switch control circuit 42 and switches switch 40 to the open state, the signal from the arc detection circuit may be inputted to a device other than switch control circuit 42. Such a variation will be described with reference to the drawings. FIG. 8 is a block diagram illustrating another connection configuration of arc detection circuit 10 according to Embodiment 1. As illustrated in FIG. 8, arc detection circuit 10 may output a signal to power conditioner 50. Power conditioner 50 may stop the operation or interrupt the power inputted from transmission path 36, in response to the signal from the arc detection circuit. Accordingly, supply of the power from PV panel 30 to power conditioner 50 can be stopped when an arc has occurred.

Moreover, one aspect of the present invention may be implemented as a switch system including the arc detection circuit according to each of the above embodiments, and switch 40 that is controlled based on the signal outputted from the arc detection circuit. Furthermore, switch 40 may include the arc detection circuit.

Moreover, one aspect of the present invention may be implemented as a power conditioner system including the arc detection circuit according to each of the above embodiments and power conditioner 50 to which power from the power supply apparatus is supplied via transmission path 36. Furthermore, power conditioner 50 may include the arc detection circuit.

Although the arc detection circuit according to each of the above embodiments is implemented as software using a microcontroller unit, the arc detection circuit may be implemented as software in a general purpose computer, such as a personal computer. Furthermore, the arc detection circuit may be implemented as hardware by using a dedicated electronic circuit including an A to D converter, a logical circuit, a gate array, a D to A converter, and so on.

The scope of the present invention may also include embodiments as a result of adding various modifications to each of the embodiments that may be conceived by those skilled in the art, and embodiments obtained by combining the structural elements and functions in each of the embodiments in any manner as long as the combination does not depart from the scope of the present invention.

The invention claimed is:

1. An arc detection circuit that detects an arc that occurs in a transmission path that transmits power from a power supply apparatus to a power conditioner, the arc detection circuit comprising:
    a current detector that detects a current flowing through the transmission path;
    a storage unit configured to store one or both of a first plurality of base characteristics, each of the first plurality of base characteristics corresponding to a different one of operating conditions of the power conditioner, and a second plurality of base characteristics, each of the second plurality of base characteristics corresponding to a different one of a plurality of types of power conditioners, the first plurality and the second plurality of base characteristics each being a base characteristic which is a frequency characteristic of the current flowing through the transmission path when the arc is not present; and
    an arc determination unit configured to determine whether the arc has occurred based on a result of a comparison between a detection characteristic and one base characteristic that is selected from among the first plurality of base characteristics based on one of the operating conditions of the power conditioner or from among the second plurality of base characteristics based on one of the plurality of types of the power conditioners, wherein the detection characteristic is the frequency characteristic of the current detected by the current detector.

2. The arc detection circuit according to claim 1, wherein the storage unit is configured to obtain the selected base characteristic based on the current detected when the arc is not present.

3. A switch system, comprising:
    the arc detection circuit according to claim 1; and
    a switch that is controlled based on a signal outputted from the arc detection circuit.

4. A power conditioner system, comprising:
    The arc detection circuit according to claim 1; and
    the power conditioner to which power from the power supply apparatus is supplied via the transmission path.

5. An arc detection method for detecting an arc in a transmission path that transmits power from a power supply apparatus to a power conditioner, the arc detection method comprising:
    detecting a current flowing through the transmission path;
    storing one or both of a first plurality of base characteristics, each of the first plurality of base characteristics corresponding to a different one of operating conditions of the power conditioner, and a second plurality of base characteristics, each of the second plurality of base characteristics corresponding to a different one of a plurality of types of power conditioners, the first plurality and the second plurality of base characteristics each being a base characteristic which is a frequency characteristic of the current flowing through the transmission path when the arc is not present; and
    determining whether the arc has occurred based on a result of a comparison between a detection characteristic and one base characteristic that is selected from among the first plurality of base characteristics based on one of the operating conditions of the power conditioner or from among the second plurality of base characteristics based on one of the plurality of types of the power conditioners, wherein the detection characteristic is the frequency characteristic of the current detected in the detecting.

* * * * *